United States Patent
Mahlbacher

Patent Number: 6,008,660
Date of Patent: Dec. 28, 1999

[54] METHOD FOR DEVELOPING CIRCUIT CAPACITANCE MEASUREMENTS CORRECTED FOR STRAY CAPACITANCE

[75] Inventor: James Christopher Mahlbacher, Lake Worth, Fla.

[73] Assignee: International Business Machines Corporation, Armonk, N.Y.

[21] Appl. No.: 08/701,621

[22] Filed: Aug. 22, 1996

[51] Int. Cl.[6] ................................................. G01R 27/26
[52] U.S. Cl. ........................... 324/661; 324/684; 324/601
[58] Field of Search .................... 324/601, 672, 324/679, 684, 687, 688, 663, 225, 207.12

[56] References Cited

U.S. PATENT DOCUMENTS

| | | | |
|---|---|---|---|
| 4,251,767 | 2/1981 | Montana | 324/684 |
| 4,775,830 | 10/1988 | Oy | 324/601 |
| 4,806,846 | 2/1989 | Kerber | 324/678 |
| 5,212,454 | 5/1993 | Proebsting | 324/679 |
| 5,357,191 | 10/1994 | Grace | 324/678 |
| 5,430,383 | 7/1995 | Boos | 324/679 |

*Primary Examiner*—Ernest F. Karlsen
*Assistant Examiner*—Diep Do
*Attorney, Agent, or Firm*—Richard A. Tomlin; Ronald V. Davidge

[57] ABSTRACT

Accuracy of capacitance measurements taken with flying probes—probes that are movable relative to each other and surfaces of an object containing circuits being tested (e.g. a printed circuit board)—is improved by dynamically applying corrections for stray capacitance as individual probes are selected for measurements. Measuring circuitry to which the probes are linked includes multiplexor circuitry. The latter stray capacitance encompassing the stray capacitance between the one movable probe and the other movable probes as well as the cabling between the latter probes and the multiplexor circuitry. For these measurements, the reference point is contacted either by a fixed conductor or another one of the movable probes (other than the probe aligned with the test point) that is currently usable for that purpose. As the one movable probe is moved into alignment with the test point, while out of contact with the object, a first capacitance measurement is taken and saved; that measurement representing the stray capacitance between that one probe and both the reference point and the other probes. The one probe is then moved into contact with the respective test point and a second capacitance measurement is taken and saved; that measurement representing capacitance between the respective test point and the reference point. The saved first measurement is subtracted from the saved second measurement, and the result is saved as a corrected measurement; i.e. a measure of the capacitance between the respective test point and reference point, corrected for all relevant stray capacitances.

8 Claims, 1 Drawing Sheet

METHOD FOR DEVELOPING CIRCUIT CAPACITANCE MEASUREMENTS CORRECTED FOR STRAY CAPACITANCE

FIELD OF THE INVENTION

This invention pertains to making capacitance measurements using flying probes i.e. probes that are moved relative to both each other and selected test points on an object such as a printed circuit card or board.

BACKGROUND OF THE INVENTION

Known prior art teaches that: (1) accuracy of capacitance measurements taken with a single probe can be improved by applying corrections for stray capacitance; (2) a system of plural relatively movable probes (i.e. flying probes) can be used in capacitance measurements to verify probe placement; and (3) flying probes can be used to measure both capacitance and resistance.

However, presently known flying probe systems are believed to be incapable of correcting for all stray capacitances, especially those between a probe taking a measurement and other probes, so that measurements presently made by such systems are considered to be less accurate than they could be. The present invention seeks to overcome this shortcoming, by adapting flying probe systems to dynamically correct for stray capacitance, including stray capacitance between a movable probe taking a given measurement and other movable probes.

SUMMARY OF THE INVENTION

In accordance with this invention, a flying probe system is adapted to provide corrections for stray capacitance as capacitance measurements are taken relative to discrete test points on an object. An object to be tested (e.g. a printed circuit card) is placed in a test fixture, and a reference point (or set of points) on the object is placed in contact with either a fixed probe (or contact wire or chuck) or one of the movable probes instantly available for that usage. The remaining movable probes (those other than the one contacting the reference point, if a movable probe is so used) are moved into positions over selected test points on the object, with their tips removed from contact with the object surface. As each remaining movable probe is so positioned, a first capacitance measurement is taken, relative to the test point over which the respective movable probe is positioned, and that measurement is saved. The respective movable probe is then moved into contact with the same test point and a second capacitance measurement is taken and saved. Subtraction of each first measurement from the respective second measurement results in a capacitance value that is corrected for stray capacitance between the respective probe and other objects in the system; i.e. a capacitance measurement more accurate than the respective second measurement per se.

Each first measurement effectively measures stray capacitance between the tip of the respective movable probe (the probe above the point instantly being tested) and the reference point(s), as well as stray capacitance between the same probe tip and other probes and their cabling.

To effect these measurements, a multiplexor connects individual movable probes and the reference connector (fixed or movable probe, wire, etc.) to a capacitance meter.

It has been determined that corrected measurements made in this manner improve the sensitivity of resultant measurements from a level of about several pico-farads (uncorrected) to about 80 fempto-farads (corrected).

The foregoing and other features, aspects, benefits and advantages of my invention will be more fully understood and appreciated from the following description.

DETAILED DESCRIPTION

1. Orientation of Test Objects and Probes

Figure 1:
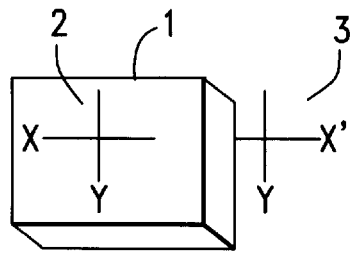
FIG. 1 is a three-dimensional view of a measurable object with spatial references for explaining how test probes are positioned relative to the object.
Figure 2:
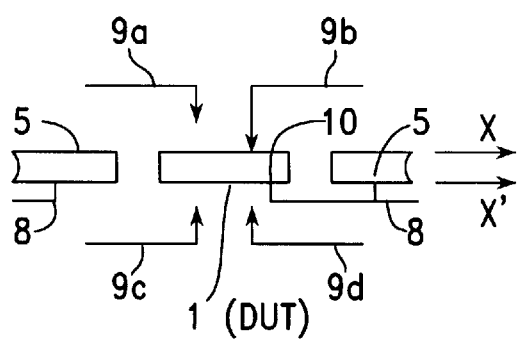
FIG. 2 is an end view of the same object located in a test holding fixture, illustrating positions of movable probes and a stationary reference probe (or wire) relative to surfaces of the object.

FIGS. 1 and 2 are used to explain how presently used probes are oriented relative to a device under test (hereafter "DUT"), such as a printed circuit card or board, for making capacitance measurements of the kind presently contemplated.

DUT 1, seen in perspective in FIG. 1, has top and bottom surfaces lying in parallel planes. The plane containing the top surface is indicated by coordinates X,Y shown at 2, and the plane containing the bottom surface indicated by coordinates X',Y' shown at 3.

In FIG. 2, DUT 1 is shown (in an end view) positioned in a holding fixture 5, in which it is held while the subject measurements are made. In this figure, X and X' axes of planes respectively containing top and bottom surfaces of the DUT are shown to the right of the DUT and fixture 5. Fixture 5 is provided with a reference potential via fixed conductor (or conductors) 8.

FIG. 2 shows four movable/flying probes—9a, 9b, 9c and 9d—above and below object 1; although it should be understood that a system in accordance with this invention could have less than four or more than four such probes. A reference point (or area) on the bottom surface of object 1 is contacted by a probe (or conductor) 10 that is connected to the same reference potential as conductors 8. Conductor 10 may be either a fixed conductor or one of the movable probes instantly available for such usage (i.e. for contacting the reference point/area). When a movable probe is used to contact the reference point(s), the reference potential can be applied transiently to that probe, for the duration of a test currently being made, and removed when the test has been completed.

As seen in FIG. 2, there is a discrete space between tips of probes 9a, 9c and 9d nearest surface points on DUT 1, and no space between the tip of probe 9b and a respective surface point on the DUT. This is meant to indicate that these tips can be moved individually not only parallel to the X,Y and X',Y' planes, while out of contact with the DUT, but also perpendicular to those planes to make contact (physical and electrical) with discrete points on the DUT at which certain of the present capacitance measurements are to be taken.

2. Connection Between Probes and Capacitance Meter

Figure 3:
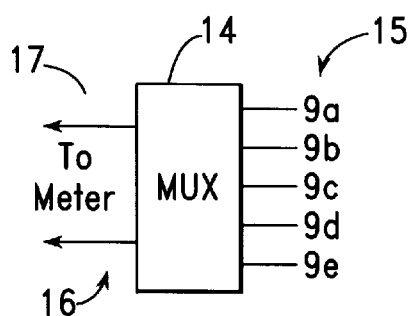
FIG. 3 schematically illustrates the multiplexor and metering circuitry to which the probes connect.

FIG. 3 shows multiplexor 14 receiving five inputs 15 from probes 9n (n=a, b, c, or d) and 10, and having two outputs 16 extending to not-shown metering circuitry which makes the capacitance measurements. For each measurement to be made, multiplexor 14 connects reference probe 10 (or one of the moving probes 9n serving momentarily as a reference probe) to a reference point (or area) on the DUT, and couples one of the moving probes 9n between the metering circuitry and a test point on the DUT; a test point being any point at which a capacitance measurement is to be taken.

3. Measurement and Calculation Processes of the Invention

Figure 4:
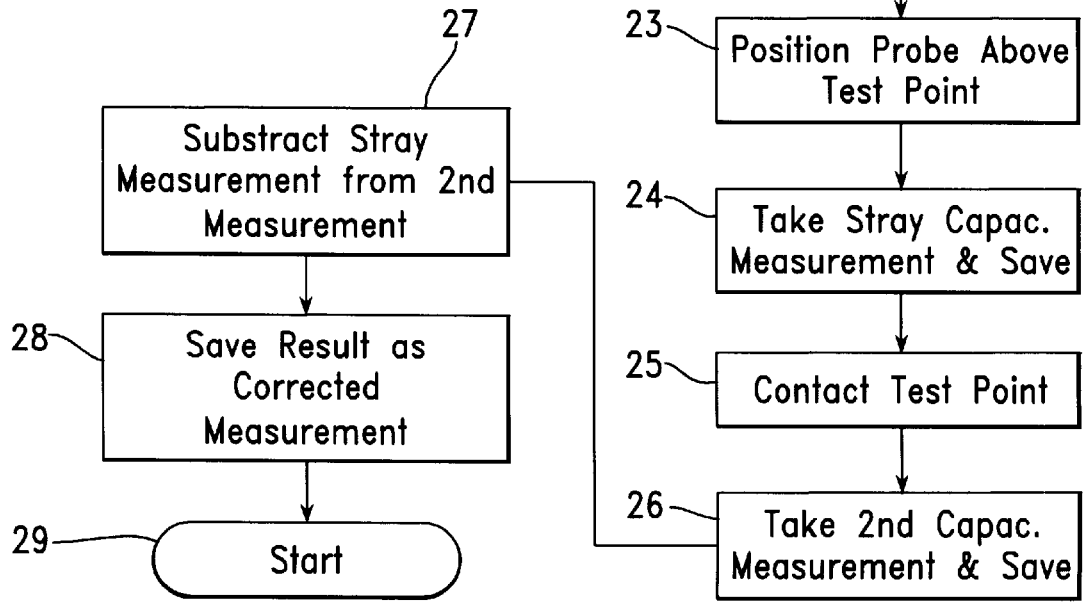
FIG. 4 is a flow diagram showing how corrected capacitance measurements are obtained in accordance with this invention.

Capacitance measurement processes and calculations, for determining capacitance between a single test point on object 1 and the reference point(s) contacted by reference probe/wire 10 (or by one of the moving probes momentarily used as a reference probe), are described with reference to the flow diagram in FIG. 4 and the connection configurations shown in FIGS. 2 and 3. Some or all of these processes are repeated for determining capacitances at other test points.

At the start 20, one or more of the movable probes (9n) is/are positioned for movement relative to the DUT, in an operation shown at 21. In this movement, tip of each respective movable probe is held physically out of contact with the nearest surface of the the DUT.

As suggested earlier, each test point is a point at which capacitance measurements are to be taken relative to electrical circuits on the DUT lying between the respective test point and the reference point(s) contacted by stationary probe/wire 10 (or, in the alternative, one of the moving probes currently serving as a reference probe).

In the next operation 22, multiplexor 14 is operated to connect reference probe 10 (or one of the moving probes immediately used as a reference probe) to the metering circuitry. As shown at 23, at completion of operations/procedures 21 and 22, the tip of one of the movable probes is positioned "above" a test point (a point at which a measurement of capacitance—of circuitry lying between the respective test point and the reference point—is to be taken); the term "above" being used here to mean that the probe tip above the test point is facing that test point but physically removed from contact with it.

Next, as shown at 24, a first capacitance measurement is taken and saved. This measurement, in effect, is a reading of stray capacitance between the tip of the movable probe 9n above the test point and reference probe 10 (or one of the movable probes instantly being used as a reference probe), and includes any stray capacitance between the respective movable probe above the test point and the other movable probes and their cabling to multiplexor 14.

Next, as shown at 25, the movable probe above the test point is moved down (perpendicular to the object surface) into contact with the respective test point, and, as seen at 26, a second capacitance reading is taken and saved. This second reading, in effect constitutes an uncorrected measure of the capacitance between the respective test point and the reference point(s) contacted by wire 10.

As shown at 27, the saved first reading is subtracted from the saved second reading, and as shown at 28 the resulting difference value is saved as a corrected capacitance measurement for the respective test point (a measurement corrected to account for stray capacitance between the respective movable probe and the object, the other probes and the measuring system).

The "end" indication at 29 is intended to imply that this completes the procedure for determining corrected capacitance relative to a single test point. If determinations are to be made relative to other test points, some or all of the operations 21–28 are repeated. If a next test point is already facing one of the movable probes, only operations 22–28 are repeated, whereas if a next test point is not in such position all operations 21–28 are repeated.

In view of the foregoing, I claim:

1. A method for measuring capacitance on an object containing electrical circuits, said method comprising:

positioning one of a plurality of movable probes in electrical contact with a selected test point on said object, said probes being movable relative to both each other and said object;

applying a reference potential to a reference point on said object that is remote from said selected test point;

utilizing said one of said movable probes, taking a measurement of capacitance with said one of said movable probes in contact with said selected test point, said capacitance being measured between said selected test point and said reference point; and applying a correction to said first capacitance measurement; said correction serving to correct for stray capacitance between said one of said probes in contact with said selected test point and others of said plurality of movable probes.

2. A method for measuring capacitance in accordance with claim 1 wherein said correction for stray capacitance is obtained by taking a capacitance measurement with said one of said movable probes lying over but removed from electrical contact with said selected test point, and subtracting said capacitance measurement with said one of said movable probes lying over but removed from electrical contact with said selected test point from said measurement of capacitance with said one of said movable probes in contact with said selected test point.

3. A method for measuring capacitance in accordance with claim 2 wherein: said capacitance measurement with said one of said movable probes lying over but removed from electrical contact with said selected test point is taken before said measurement of capacitance with said one of said movable probes in contact with said selected test point; representations of both said capacitance measurement with said one of said movable probes lying over but removed from electrical contact with said selected test point and said measurement of capacitance with one of said movable probes in contact with said selected test point are saved as the respective measurements are taken; said representation of said capacitance measurement with said one of said movable probes lying over but removed from electrical contact with said selected test point is subtracted from said saved representation of said measurement of capacitance with said one of said movable proves in contact with said selected test point to form a difference saved as a corrected capacitance measurement.

4. A method for measuring capacitance in accordance with claim 1 wherein said reference potential is applied to said reference point on said object via a fixed conductor separate from said plurality of movable probes.

5. A method for measuring capacitance in accordance with claim 1 wherein said reference potential is applied to said reference point on said object via one of said other movable probes that is instantly near said reference point while said one of said movable probes is being placed in contact with said selected test point.

6. A method for measuring capacitance comprising:

positioning one of a plurality of movable probes in alignment with a selected test point on a stationary object; said probes being movable relative to each other and said object;

taking a first capacitance measurement with said one of said movable probes removed from contact with said selected test point; said first measurement representing stray capacitance between said one of said movable probes and other said movable probes, as well as stray capacitance between said one of said movable probes and a predetermined reference point on said object; said test point and reference point being discretely separated from each other;

saving said first capacitance measurement;

taking a second capacitance measurement with said one of said movable probes contacting said test point; said second measurement representing the capacitance between said test point and said reference point; and subtracting said first saved measurement from said second measurement to produce a resulting capacitance value representing the capacitance between said test point and said reference point corrected for stray capacitances currently existing between said one of said movable probes and other said movable probes as well as between said one of said movable probes and said reference point.

7. A method for measuring capacitance in accordance with claim 6 wherein said first and second capacitance measurements are taken in succession as said one of said movable probes is first moved into alignment with said test point, while removed from contact with said object, and then moved into contact with said test point.

8. A method for measuring capacitance in accordance with claim 6 wherein said first and second capacitance measurements are taken successively, by a measuring system connected to all of said movable probes, and each measurement is saved; and wherein said saved first measurement is subtracted from said saved second measurement to produce said resulting capacitance value corrected for stray capacitance.

* * * * *